(12) United States Patent
Morikawa

(10) Patent No.: US 12,508,219 B2
(45) Date of Patent: Dec. 30, 2025

(54) PHOTOCURABLE RESIN COMPOSITION FOR NAILS OR ARTIFICIAL NAILS, CURED PRODUCT, AND METHOD FOR COATING NAILS OR ARTIFICIAL NAILS

(71) Applicant: THREEBOND CO., LTD., Hachioji (JP)

(72) Inventor: Yumi Morikawa, Hachioji (JP)

(73) Assignee: THREEBOND CO., LTD., Tokyo (JP)

( * ) Notice: Subject to any disclaimer, the term of this patent is extended or adjusted under 35 U.S.C. 154(b) by 415 days.

(21) Appl. No.: 18/272,521

(22) PCT Filed: Dec. 23, 2021

(86) PCT No.: PCT/JP2021/048019
§ 371 (c)(1),
(2) Date: Jul. 14, 2023

(87) PCT Pub. No.: WO2022/163248
PCT Pub. Date: Aug. 4, 2022

(65) Prior Publication Data
US 2024/0091127 A1 Mar. 21, 2024

(30) Foreign Application Priority Data
Jan. 28, 2021 (JP) ................. 2021-012014

(51) Int. Cl.
| | | |
|---|---|---|
| A61K 8/87 | (2006.01) | |
| A61K 8/34 | (2006.01) | |
| A61K 8/35 | (2006.01) | |
| A61K 8/36 | (2006.01) | |
| A61K 8/37 | (2006.01) | |
| A61K 8/41 | (2006.01) | |
| A61K 8/55 | (2006.01) | |
| A61K 8/86 | (2006.01) | |
| A61Q 3/02 | (2006.01) | |

(52) U.S. Cl.
CPC ............... *A61K 8/87* (2013.01); *A61K 8/345* (2013.01); *A61K 8/35* (2013.01); *A61K 8/36* (2013.01); *A61K 8/37* (2013.01); *A61K 8/41* (2013.01); *A61K 8/55* (2013.01); *A61K 8/86* (2013.01); *A61Q 3/02* (2013.01); *A61K 2800/59* (2013.01); *A61K 2800/81* (2013.01)

(58) Field of Classification Search
USPC .......................................................... 424/61
See application file for complete search history.

(56) References Cited

U.S. PATENT DOCUMENTS

| | | | |
|---|---|---|---|
| 2012/0276028 A1 | 11/2012 | Kojima et al. | |
| 2013/0263875 A1* | 10/2013 | Burgess | A61K 8/72 132/73 |
| 2017/0029557 A1* | 2/2017 | Inoue | C08J 5/248 |
| 2017/0157022 A1 | 6/2017 | Saito | |

FOREIGN PATENT DOCUMENTS

| | | |
|---|---|---|
| JP | 2011-121867 A | 6/2011 |
| JP | 2016-175959 A | 10/2016 |
| JP | 2017-105759 A | 6/2017 |
| JP | 2020-012015 A | 1/2020 |
| JP | 2020-202362 A | 12/2020 |

OTHER PUBLICATIONS

Office Action, dated Apr. 15, 2025, issued for the corresponding Taiwanese Patent Application No. 110149228, 14 pages, with English translation.
International Search Report dated Mar. 8, 2022 for the corresponding patent application No. PCT/JP2021/048019, with English translation.
Office Action, dated May 21, 2025, which was issued for the corresponding Chinese Patent Application No. 202180091136.6, 11 pages, with English translation.
Office Action, dated Oct. 28, 2025, which was issued for the corresponding Japanese Patent Application No. 2022-578172, 6 pages, with English translation.

* cited by examiner

*Primary Examiner* — Walter E Webb
(74) *Attorney, Agent, or Firm* — LUCAS & MERCANTI, LLP

(57) ABSTRACT

A photocurable resin composition for nails or artificial nails, contains the following components (A) to (D): a component (A): a urethane (meth)acrylate oligomer, a component (B): a monomer selected from the group consisting of a (meth)acrylate monomer, a (meth)acrylamide monomer, and (meth)acrylic acid (excluding the component (A)), a component (C): polyglycerol having no (meth)acryloyl group and/or a compound having a polyglyceryl ether skeleton having no (meth)acryloyl group, a component (D): a photoinitiator. A molecular weight of the component (C) is 200 or more.

10 Claims, No Drawings

PHOTOCURABLE RESIN COMPOSITION FOR NAILS OR ARTIFICIAL NAILS, CURED PRODUCT, AND METHOD FOR COATING NAILS OR ARTIFICIAL NAILS

CROSS REFERENCE TO RELATED APPLICATION

This Application is a 371 of PCT/JP2021/048019 filed on Dec. 23, 2021, which claimed priority of Japanese Patent Application 2021-012014 filed on Jan. 28, 2021, both of which are incorporated herein by reference.

TECHNICAL FIELD

The present invention relates to a photocurable resin composition suitable for coating nails or artificial nails, a cured product, and a method for coating nails or artificial nails.

BACKGROUND ART

In a nail field, photocurable resin compositions (UV nail gels) containing a photopolymerizable monomer and/or an oligomer have been conventionally known. These UV nail gels are those to decorate nails to put makeup on the nails by applying the resin to the nails using a brush or the like and then irradiating the resin with light to cure the resin, and nail cosmetic films that are beautifully glossy and have high adhesion to the nails are obtained. Since the above step is a step of curing the resin directly on the nails as above, the curing heat is directly transferred to the nails, and it sometimes causes a pain, so that a resin having low curing heat has been desired conventionally.

In Japanese Patent Laid-Open No. 2020-12015, a photocurable resin composition containing a urethane (meth) acrylate resin having a polytetramethylene glycol skeleton and having 2 to 5 functional groups, a (meth)acrylate monomer, a polyether-modified polysiloxane copolymer, and a photopolymerization initiator, and having an exothermic temperature of less than 55° C. during curing is disclosed.

SUMMARY OF INVENTION

Technical Problem

The present inventor has earnestly studied such a photocurable resin composition for nails or artificial nails, which has low curing heat, as in Japanese Patent Laid-Open No. 2020-12015.

Therefore, an object of the present invention is to provide a photocurable resin composition for nails or artificial nails, which has low curing heat.

Another object of the present invention is to provide a photocurable resin composition from which a cured product having sufficient hardness (degree of hardness) can be obtained.

Means for Solving Problem

The gist of the present invention will be described below.

[1] A photocurable resin composition for nails or artificial nails, comprising the following components (A) to (D), wherein a molecular weight of the component (C) is 200 or more;

a component (A): a urethane (meth)acrylate oligomer,
a component (B): a monomer selected from the group consisting of a (meth)acrylate monomer, a (meth)acrylamide monomer, and (meth)acrylic acid (excluding the component (A)),
a component (C): polyglycerol having no (meth)acryloyl group and/or a compound having a polyglyceryl ether skeleton having no (meth)acryloyl group,
a component (D): a photoinitiator.

[2] The photocurable resin composition for nails or artificial nails according to [1], wherein the molecular weight of the component (C) is 200 or more and 5,000 or less.

[3] The photocurable resin composition for nails or artificial nails according to [1] or [2], wherein the component (C) is polyglycerol having no (meth)acryloyl group and/or a polyoxyalkylene polyglyceryl ether having no (meth)acryloyl group.

[4] The photocurable resin composition for nails or artificial nails according to any one of [1] to [3], further comprising water as a component (E).

[5] The photocurable resin composition for nails or artificial nails according to any one of [1] to [4], wherein the component (D) is an acylphosphine oxide-based photoinitiator and/or an alkylphenone-based photoinitiator.

[6] The photocurable resin composition for nails or artificial nails according to any one of [1] to [5], comprising, based on 100 parts by mass of the component (A), 10 to 200 parts by mass of the component (B), and comprising, based on 100 parts by mass of the component (A) and the component (B), 0.1 to 50 parts by mass of the component (C) and 0.1 to 15 parts by mass of the component (D).

[7] The photocurable resin composition for nails or artificial nails according to any one of [1] to [6], further comprising a polyfunctional thiol compound.

[8] The photocurable resin composition for nails or artificial nails according to any one of [1] to [7], satisfying the following conditions:

when the photocurable resin composition X for nails or artificial nails and a resin composition Y which does not contain the component (C) in the resin composition X are each prepared, a DSC peak maximum value $\alpha$(mW) of the resin composition X and a DSC peak maximum value $\beta$(mW) of the resin composition Y satisfy $100-(\alpha/\beta \times 100) > 5\%$.

[9] A cured product obtained by curing the photocurable resin composition for nails or artificial nails according to any one of [1] to [8].

A method for coating nails or artificial nails, comprising applying the photocurable resin composition for nails or artificial nails according to any one of [1] to [8] to a nail or an artificial nail to form a coating film, and then irradiating the coating film with an active energy ray to cure the coating film.

DESCRIPTION OF EMBODIMENTS

Hereinafter, embodiments of the present invention will be described. The present disclosure is not limited to the following embodiments only. In the present specification, "X to Y" means a range including numerical values described before and after that (X and Y) as the lower limit and the upper limit. The concentration "%" represents mass concentration "% by mass" unless otherwise noted, and a ratio means a mass ratio unless otherwise noted.

Unless otherwise specified, operations and measurement of properties, etc. are carried out under the conditions of room temperature (20 to 25° C.)/relative humidity 40 to 50%

RH. "A and/or B" specifically means at least one of A and B, and means A, B, and a combination of A and B.

<Photocurable Resin Composition for Nails or Artificial Nails>

The photocurable resin composition for nails or artificial nails according to one embodiment of the present invention (also referred to as the "photocurable resin composition" or the "composition" simply, hereinafter) comprises the following components (A) to (D), and a molecular weight of the component (C) is 200 or more;
- a component (A): a urethane (meth)acrylate oligomer,
- a component (B): a monomer selected from the group consisting of a (meth)acrylate monomer, a (meth)acrylamide monomer, and (meth)acrylic acid (excluding the component (A)),
- a component (C): polyglycerol having no (meth)acryloyl group and/or a compound having a polyglyceryl ether skeleton having no (meth)acryloyl group,
- a component (D): a photoinitiator.

According to one embodiment of the present invention, a photocurable resin composition for nails or artificial nails having low curing heat can be provided. Moreover, the photocurable resin composition of one embodiment of the present invention has a viscosity suitable for work of application to nails or artificial nails. According to the photocurable resin composition that is one embodiment of the present invention, a cured product having sufficient hardness (degree of hardness) as a coating for a nail and an artificial nail can be obtained.

<Component (A)>

The component (A) contained in the photocurable resin composition according to the present invention is a urethane (meth)acrylate oligomer. The urethane (meth)acrylate oligomer is an oligomer having one or more urethane bonds and one or more (meth)acryloyl groups. When the urethane (meth)acrylate oligomer is added, an effect of improving adhesion to nails or artificial nails and an effect of improving curability and strength of the photocurable resin composition (coating film) are obtained. In the present specification, the urethane (meth)acrylate oligomer may have a (meth)acryloyl group in the form of an acryloyloxy group. The term "(meth)acryloyl" includes both of acryloyl and methacryloyl. Therefore, for example, the term "(meth)acryloyl group" includes both of acryloyl group ($H_2C=CH-C(=O)-$) and methacryloyl group ($H_2C=C(CH_3)-C(=O)-$). Likewise, the term "(meth)acrylate" includes both of acrylate and methacrylate, and the term "(meth)acrylic" includes both of acrylic and methacrylic. The "oligomer" refers to a polymer in which about 2 to dozens of monomer units are repeated.

The component (A) is not particularly restricted as long as it is an oligomer having one or more urethane bonds and one or more (meth)acryloyl groups, but it preferably contains 2 to 6 (meth)acryloyl groups, more preferably contains 2 to 3 (meth)acryloyl groups, and still more preferably contains 3 (meth)acryloyl groups. The oligomer can contribute to decrease in curing heat of the present photocurable resin composition because it contains 2 to 6 (meth)acryloyl groups. The (meth)acryloyl group of the component (A) is preferably an acryloyl group. The oligomer may further contain, in addition to the urethane bond and the (meth)acryloyl group, other functional groups, such as a carboxyl group, a phosphate group, an epoxy group, and a hydroxyl group.

The weight-average molecular weight of the oligomer of the component (A) is preferably 1,000 to 100,000, and more preferably 2,000 to 70,000. When the weight-average molecular weight is in the above range, curability of a cured product can be improved while keeping a viscosity favorable for the workability. In the present specification, as the weight-average molecular weight, a value measured by gel permeation chromatography (GPC) using polystyrene as a standard substance is adopted.

The urethane (meth)acrylate oligomer having a urethane bond can be synthesized by forming a urethane bond through the reaction of polyol with polyisocyanate and adding a compound having a hydroxyl group and a (meth)acryloyl group in a molecule or (meth)acrylic acid to the unreacted isocyanate group, but the method for synthesizing the (meth)acrylate oligomer is not limited to this method. The urethane (meth)acrylate oligomer preferably has a polyalkylene glycol skeleton, and more preferably has a polypropylene glycol skeleton. Since the oligomer has a polyalkylene glycol skeleton, adhesion to nails or artificial nails can be improved. Moreover, the urethane (meth)acrylate oligomer preferably has a cyclic structure, and more preferably has an alicyclic structure. The oligomer preferably has two or more cyclic structures, and more preferably has two cyclic structures. Since the urethane (meth)acrylate oligomer has a cyclic structure, curability of the photocurable resin composition of the present invention and strength of a cured product can be improved.

Specific examples of commercial products of the component (A) include, but not limited to, AH-600 (phenyl glycidyl ether acrylate hexamethylene diisocyanate urethane prepolymer, having 2 (meth)acryloyl groups), AT-600 (phenyl glycidyl ether acrylate toluene diisocyanate urethane prepolymer, having 2 (meth)acryloyl groups), UA-306H (pentaerythritol triacrylate hexamethylene diisocyanate urethane prepolymer, having 2 (meth)acryloyl groups), and UF-8001G (non-yellowing type oligourethane acrylate, having 2 (meth)acryloyl groups) (manufactured by KYOUEI-SHA CHEMICAL Co., Ltd.), RUA-071 (hexafunctional urethane acrylate, having 6 (meth)acryloyl groups), RUA-003VE (pentadecafunctional urethane acrylate, having 15 (meth)acryloyl groups), RUA-075 (pentafunctional urethane acrylate, having 5 (meth)acryloyl groups), and RUA-048 (trifunctional urethane acrylate, having 3 (meth)acryloyl groups) (manufactured by ASIA INDUSTRY CO., LTD.), and UN-9200A (polycarbonate-based bifunctional urethane acrylate, having 2 (meth)acryloyl groups), UN-9000PEP (polycarbonate-based bifunctional urethane acrylate, having 2 (meth)acryloyl groups), UN-7700 (polyester-based bifunctional urethane acrylate, having 2 (meth)acryloyl groups), and KY-11 (polyether-based trifunctional urethane acrylate, having 3 (meth)acryloyl groups) (manufactured by Negami Chemical Industrial Co., Ltd.).

<Component (B)>

The component (B) contained in the photocurable resin composition according to the present invention is a monomer selected from the group consisting of a (meth)acrylate monomer, a (meth)acrylamide monomer, and (meth)acrylic acid (excluding the component (A)). The (meth)acrylate monomer and the (meth)acrylamide monomer are not particularly restricted, and those known can be used. Among these, a monofunctional, bifunctional or trifunctional monomer is preferable as the monomer of the component (B). The component (B) preferably contains a combination of a plurality of monomers that differ in the number of functional groups, and more preferably contains monofunctional and bifunctional monomers. The component (B) can contribute to improvement in adhesion to nails or artificial nails because it contains a plurality of monomers that differ in the number of functional groups.

The content of the component (B) in the photocurable resin composition according to one embodiment of the present invention (when two or more monomers are used in combination as the component (B), the content of the component (B) refers to the total amount of them) is preferably in the range of 10 to 200 parts by mass, and more preferably 15 to 150 parts by mass, based on 100 parts by mass of the content of the component (A). When the content is in the above range, a cured product that is tough and has excellent adhesion can be obtained from the photocurable resin composition of the present invention.

Specific examples of the monofunctional (meth)acrylate monomers include, but not limited to, lauryl (meth)acrylate, stearyl (meth)acrylate, ethyl carbitol (meth)acrylate, tetrahydrofurfuryl (meth)acrylate, caprolactone-modified tetrahydrofurfuryl (meth)acrylate, cyclohexyl (meth)acrylate, dicyclopentanyl (meth)acrylate, isobornyl (meth)acrylate, benzyl (meth)acrylate, phenyl (meth)acrylate, phenoxyethyl (meth)acrylate, phenoxydiethylene glycol (meth)acrylate, phenoxytetraethylene glycol (meth)acrylate, nonyl phenoxyethyl (meth)acrylate, nonyl phenoxytetraethylene glycol (meth)acrylate, methoxydiethylene glycol (meth)acrylate, ethoxydiethylene glycol (meth)acrylate, butoxyethyl (meth)acrylate, butoxytriethylene glycol (meth)acrylate, 2-ethylhexyl polyethylene glycol (meth)acrylate, 4-hydroxybutyl (meth)acrylate, nonylphenyl polypropylene glycol (meth)acrylate, methoxydipropylene glycol (meth)acrylate, 2-hydroxyethyl (meth)acrylate, 2-hydroxypropyl (meth)acrylate, polyethylene glycol (meth)acrylate, polypropylene glycol (meth)acrylate, epichlorohydrin-modified butyl (meth)acrylate, epichlorohydrin-modified phenoxy (meth)acrylate, N,N-dimethylaminoethyl (meth)acrylate, N,N-diethylaminoethyl (meth)acrylate, 3-(meth)acryloyloxypropylsuccinic acid, 4-(meth)acryloyloxybutylsuccinic acid, 2-(meth)acryloyloxyethylmaleic acid, 3-(meth)acryloyloxypropylmaleic acid, 4-(meth)acryloyloxybutylmaleic acid, 2-(meth)acryloyloxyethyl hexahydrophthalic acid, 3-(meth)acryloyloxypropyl hexahydrophthalic acid, 4-(meth)acryloyloxybutyl hexahydrophthalic acid, 2-(meth)acryloyloxyethylphthalic acid, 3-(meth)acryloyloxypropylphthalic acid, 4-(meth)acryloyloxybutylphthalic acid, and 2-hydroxyethyl methacrylate acid phosphate.

Among these, a monofunctional (meth)acrylate monomer having a hydroxyl group is preferably contained as the monofunctional (meth)acrylate monomer. Specific examples of the monofunctional (meth)acrylate monomers having a hydroxyl group include, but not limited to, 2-hydroxyethyl (meth)acrylate and 2-hydroxypropyl (meth)acrylate. Among these, 2-hydroxypropyl (meth)acrylate is preferable, and 2-hydroxypropyl methacrylate is more preferable, as the monofunctional (meth)acrylate monomer having a hydroxyl group. The monofunctional monomer having a hydroxyl group may be a commercial product, and specific examples of the commercial products include, but not limited to, Acryester® HP manufactured by MITSUBISHI RAYON CO., LTD.

Specific examples of the bifunctional (meth)acrylate monomers include, but not limited to, 1,3-butylene glycol di(meth)acrylate, 1,4-butylene glycol di(meth)acrylate, tricyclodecane dimethanol di(meth)acrylate, neopentyl glycol di(meth)acrylate, 1,6-hexaneglycol di(meth)acrylate, ethylene glycol di(meth)acrylate, tetraethylene glycol di(meth)acrylate, polyethylene glycol di(meth)acrylate, propylene glycol di(meth)acrylate, tripropylene glycol di(meth)acrylate, ethylene oxide-modified neopentyl glycol di(meth)acrylate, propylene oxide-modified neopentyl glycol di(meth)acrylate, bisphenol A di(meth)acrylate, ethylene oxide-modified bisphenol A di(meth)acrylate, epichlorohydrin-modified bisphenol A di(meth)acrylate, ethylene oxide-modified bisphenol S di(meth)acrylate, neopentyl glycol-modified trimethylolpropane di(meth)acrylate, dicyclopentenyl di(meth)acrylate, ethylene oxide-modified dicyclopentenyl di(meth)acrylate, diacryloyl isocyanurate, and dimethylol tricyclodecane di(meth)acrylate.

Specific examples of the trifunctional (meth)acrylate monomers include, but not limited to, trimethylolpropane tri(meth)acrylate, pentaerythritol tri(meth)acrylate, EO-modified trimethylolpropane tri(meth)acrylate, PO-modified trimethylolpropane tri(meth)acrylate, ECH-modified trimethylolpropane tri(meth)acrylate, ECH-modified glycerol tri(meth)acrylate, and tris(acryloyloxyethyl) isocyanurate.

Specific examples of the (meth)acrylamide monomers include, but not limited to, (meth)acrylamide, N-methyl (meth)acrylamide, N-ethyl (meth)acrylamide, N-propyl (meth)acrylamide, N-n-butyl (meth)acrylamide, N-tert-butyl (meth)acrylamide, N-butoxymethyl (meth)acrylamide, N-isopropyl (meth)acrylamide, N-methylol (meth)acrylamide, N,N-dimethyl (meth)acrylamide, (meth)acryloylmorpholine, N,N-diethyl (meth)acrylamide, N-methyl-N-ethyl (meth)acrylamide, and N-hydroxyethyl (meth)acrylamide.

<Component (C)>

The component (C) contained in the photocurable resin composition according to the present invention is polyglycerol having no (meth)acryloyl group and/or a compound having a polyglyceryl ether skeleton having no (meth)acryloyl group, and has a molecular weight of 200 or more. The component (C) can be a compound represented by the formula (1) and/or the formula (2).

By using the component (C), curing heat of the photocurable resin composition can be decreased. As the component (C), one compound may be used, or two or more compounds may be used.

The polyglycerol having no (meth)acryloyl group can be represented like the formula (1). Here, n in the formula (1) is preferably an integer of 3 or more, and from the viewpoint of decrease in curing heat of the photocurable resin composition, n is more preferably an integer of 3 to 45.

[Formula 1]

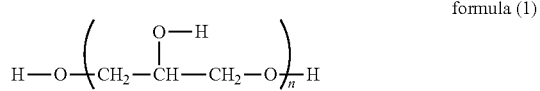

formula (1)

As the polyglycerol having no (meth)acryloyl group, a commercial product may be used, and specific examples of the commercial products include POLYGLYCERIN #310, #500, and #750 (manufactured by Sakamoto Yakuhin Kogyo Co., Ltd.), and Polyglycerol 20PW and Polyglycerol XPW (manufactured by Daicel Corporation).

The compound having a polyglyceryl ether skeleton having no (meth)acryloyl group can be represented like the formula (2).

Here, m is an integer of 1 or more, and $R^1$ is each independently a group represented by the formula (3). In the formula (3), p indicates 0 or an integer of 1 or more, $R^3$ is hydrogen or an alkyl group, and $R^2$ indicates an alkylene group. However, the formula (2) contains at least one or more $R^1$ wherein p is 1 or more and/or p is 0, and $R^3$ is an alkyl group. In other words, at least one or more groups represented by $R^1$ in the formula (2) is a group wherein p is 1 or more and/or p is 0, and $R^3$ becomes an alkyl group, in the formula (3).

[Formula 2]

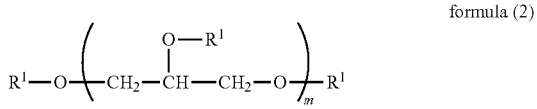

formula (2)

[Formula 3]

formula (3)

As long as the molecular weight of the compound having a polyglyceryl ether skeleton having no (meth)acryloyl group is 200 or more, m in the formula (2) is an integer of 1 or more without limitation. From the viewpoint of contribution to decrease in curing heat, m in the formula (2) is preferably an integer of 2 or more, and m is more preferably 2.

The total number of p of the formula (3) contained in one molecule of the compound having a polyglyceryl ether skeleton having no (meth)acryloyl group is preferably 2 to 45, more preferably 3 to 35, still more preferably 4 to 25, and particularly preferably 5 to 15. The total number of p in the range of 2 to can contribute to decrease in curing heat.

The compound having a polyglyceryl ether skeleton having no (meth)acryloyl group may be a polyoxyalkylene polyglyceryl ether having no (meth)acryloyl group. The polyoxyalkylene polyglyceryl ether more preferably contains at least one alkylene oxide (p is an integer of 1 or more, and $R^3$ is hydrogen) in one molecule. The polyoxyalkylene polyglyceryl ether is still more preferably polyoxyethylene polyglyceryl ether containing at least one ethylene oxide (p is an integer of 1 or more, $R^2$ is an ethylene group, and $R^3$ is hydrogen) in one molecule, or polyoxypropylene polyglyceryl ether containing at least one propylene oxide (p is an integer of 1 or more, $R^2$ is a propylene group, and $R^3$ is hydrogen) in one molecule.

As the compound having a polyglyceryl ether skeleton having no (meth)acryloyl group, a commercial product may be used, and specific examples of the commercial products include SC-P750, SC-P1000, SC-P1600, SC-E750, SC-E1000, SC-E1500, and SC-E2000 (manufactured by Sakamoto Yakuhin Kogyo Co., Ltd.).

Some commercial products each of which can be used as the component (C) contain, as impurities, 0 to 15% of water and/or 0 to 20% of glycerol. However, the content of the component (C) described later does not contain the contents of water and glycerol that can be contained as impurities. Water contained as an impurity in a commercial product that can be used as the component (C) is contained in the component (E).

The molecular weight of the component (C) is 200 or more, but is preferably 250 or more, and more preferably 290 or more. Although there is no upper limit for the molecular weight of the component (C), it is preferably 5,000 or less, and more preferably 3,500 or less. The molecular weight of the component (C) is a value calculated from a theoretical calculated value, and when it cannot be derived from a calculated value, it may be a value of a weight-average molecular weight.

The content of the component (C) (when two or more are contained, the content is the total amount of them) in the photocurable resin composition according to the present invention is preferably 0.1 to 50 parts by mass, more preferably 1 to 35 parts by mass, still more preferably 3 to 25 parts by mass, and particularly preferably 7 to 20 parts by mass, based on the total content 100 parts by mass of the component (A) and the component (B). Since the content of the component (C) based on the total content of the component (A) and the component (B) is in the above range, a photocurable resin composition having low curing heat and excellent curability is obtained.

<Component (D)>

The component (D) contained in the photocurable resin composition according to one embodiment of the present invention is a photoinitiator (photopolymerization initiator). Examples of the photoinitiator that is the component (D) include a radical initiator that generates a radical species, a cationic initiator that generates a cationic species, and an anionic initiator that generates an anionic species, through the irradiation with an active energy ray, such as a visible ray, an ultraviolet ray, an X-ray, or an electron ray, and among them, a radical photoinitiator is preferable.

Examples of the radical photoinitiators include an alkylphenone-based compound, an acylphosphine oxide-based compound, a titanocene-based compound, an oxime ester-based compound, a benzoin-based compound, an acetophenone-based compound, a benzophenone-based compound, a thioxanthone-based compound, an a-acyloxime ester-based compound, a phenyl glyoxylate-based compound, a benzyl-based compound, an azo-based compound, a diphenyl sulfide-based compound, an organic dye-based compound, an iron-phthalocyanine-based compound, a benzoin ether-based compound, and an anthraquinone-based compound. Among these, an alkylphenone-based compound or an acylphosphine oxide-based compound is preferable as the radical photoinitiator from the viewpoints of reactivity, etc. That is to say, the component (D) is preferably an acylphosphine oxide-based photoinitiator and/or an alkylphenone-based photoinitiator.

The alkylphenone-based compound is, for example, 1-hydroxycyclohexyl phenyl ketone, and the acylphosphine oxide-based compound is, for example, 2,4,6-trimethylbenzoyl diphenylphosphine oxide or bis(2,4,6-trimethylbenzoyl)phenylphosphine oxide. The component (D) can be used alone or in combination of two or more.

From the viewpoint of making gloss and transparency compatible with each other, it is preferable to use, as the component (D), an alkylphenone-based compound and an acylphosphine oxide-based compound in combination. When two or more are used in combination, the content of the component (D) refers to the total amount.

The content of the component (D) in the photocurable resin composition according to one embodiment of the present invention is 0.1 to 15 parts by mass, more preferably 1 to 12 parts by mass, and still more preferably 3 to 9 parts by mass, based on the total content 100 parts by mass of the component (A) and the component (B). With the content of the component (D) being in the above range based on the total content of the component (A) and the component (B), a photocurable resin composition having excellent curability while also having low curing heat is obtained.

<Component (E)>

The photocurable resin composition according to one embodiment of the present invention may contain water ($H_2O$) as the component (E). As the water, water containing no impurity is preferable, and pure water is particularly preferable. By adding the component (E), curing heat of the curable resin composition can be further decreased.

The lower limit of the content of the component (E) in the curable resin composition according to one embodiment of the present invention is preferably 0.001 parts by mass or more, more preferably 0.01 parts by mass or more, and still more preferably 0.1 parts by mass or more, based on the total content 100 parts by mass of the component (A) and the component (B). The upper limit of the content of the component (E) is preferably 3 parts by mass or less, more preferably 2 parts by mass or less, and still more preferably 1.5 parts by mass or less, based on the total 100 parts by mass of the component (A) and the component (B). Here, the preferred amount added refers to an amount added in which water that is an impurity in the component (C) is also included.

<Arbitrarily Components>

The photocurable resin composition according to one embodiment of the present invention can contain additives, such as a polyfunctional thiol compound, a filler, a conductive filler, a silane coupling agent, a plasticizer, a pressure-sensitive adhesive, an antifoaming agent, a pigment, an antirust agent, a leveling agent, a dispersant, a rheology modifier, and a flame retardant, as long as the object of the present invention is not impaired.

The photocurable resin composition according to one embodiment of the present invention preferably contains a polyfunctional thiol compound. Since the resin composition contains a polyfunctional thiol compound, crosslinking is accelerated, and oxygen inhibition that the (meth)acryloyl group suffers can be reduced, so that it becomes unnecessary to wipe off an uncured product remaining on the surface of a cured product after curing. The polyfunctional thiol compound is not particularly restricted as long as it is a compound in which two or more thiol groups are present in one molecule, and examples thereof include 1,2-ethanedithiol, 1,2-propanedithiol, 1,3-propanedithiol, 1,3-butanedithiol, 2,3-butanedithiol, 1,5-pentanedithiol, 1,6-hexanedithiol, 1,8-octanedithiol, 1,9-nonanedithiol, 1,10-decanedithiol, 1,2-benzenedithiol, 1,3-benzenedithiol, 1,4-benzenedithiol, 3,6-dichloro-1,2-benzenedithiol, toluene-3,4-dithiol, 1,5-naphthalenedithiol, ethylene glycol bis(thioglycolate), ethylene glycol bis(3-mercaptopropionate), 1,4-butanediol bis-thioglycolate, tetraethylene glycol bis(3-mercaptopropionate), trimethylolpropane tris (thioglycolate), trimethylolpropane tris(3-mercaptopropionate), trimethylolpropane tris(3-mercaptobutyrate), tris[(3-mercaptopropionyloxy)-ethyl] isocyanurate, pentaerythritol tetrakis(thioglycolate), pentaerythritol tetrakis(3-mercaptopropionate), dipentaerythritol hexakis(3-mercaptopropionate), 1,4-bis(3-mercaptobutylyloxy)butane, pentaerythritol tetrakis(3-mercaptobutyrate), pentaerythritol tetrakis(3-mercaptobutyrate), 1,3,5-tris(3-mercaptobutyloxyethyl)-1,3,5-triazine-2,4,6 (1H, 3H, 5H)-trione, dimercaptodiethyl sulfide, 1,8-dimercapto-3,6-dithiaoctane, 1,2-bis[(2-mercaptoethyl)thio]-3-mercaptopropane, tetrakis(7-mercapto-2,5-dithiaheptyl) methane, trithiocyanuric acid, 1,2-benzenedimethane, thiol, 4,4'-thiobisbenzenethiol, 2-di-n-butylamino-4,6-dimercapto-s-triazine, 2-di-n-butylamino-4,6-dimercapto-s-triazine, 2,5-dimercapto-1,3,4-thiadiazole, 1,8-dimercapto-3,6-dioxaoctane, 1,5-dimercapto-3-thiapentane, trimercaptopropionic acid tris(2-hydroxyethyl)isocyanurate, 1,4-dimethylmercaptobenzene, 2,4,6-trimercapto-s-triazine, 2-(N,N-dibutylamino)-4,6-dimercapto-s-triazine, bis(4-(2-mercaptopropoxy)phenyl)methane, 1,1-bis(4-(2-mercaptopropoxy)phenyl)ethane, 2,2-bis(4-(2-mercaptopropoxy)phenyl)propane, 2,2-bis(4-(2-mercaptopropoxy)phenyl)butane, 1,1-bis(4-(2-mercaptopropoxy)phenyl)isobutane, 2,2-bis(4-(2-mercaptopropoxy)-3-methylphenyl)propane, 2,2-bis(4-(2-mercaptopropoxy)-5-methylphenyl)propane, bis(2-(2-mercaptopropoxy)-5-methylphenyl)methane, 2,2-bis(4-(2-mercaptopropoxy)-3-t-butylphenyl)propane, tris(4-(2-mercaptopropoxy)phenyl)methane, 1,1,1-tris(4-(2-mercaptopropoxy)phenyl)ethane, bis(4-(2-mercaptobutoxy)phenyl)methane, 2,2-bis(4-(2-mercaptobutoxy)phenyl)propane, tris(4-(2-mercaptobutoxy)phenyl)methane, and 1,3,5-triazine-2,4,6-trithiol. As the polyfunctional thiol compounds, preferred are those obtained by the reaction of a thiol group or a compound having a group that undergoes reaction and becomes a thiol group, with hydroxyl groups inherent in trimethylolpropane, pentaerythritol and dipentaerythritol, particularly preferred are trimethylolpropane tris(3-mercaptopropionate), tris[(3-mercaptopropionyloxy)-ethyl]isocyanurate, pentaerythritol tetrakis(3-mercaptopropionate), pentaerythritol tetrakis(3-mercaptobutyrate), dipentaerythritol hexakis(3-mercaptopropionate), and dipentaerythritol hexakis(3-mercaptobutyrate), and most preferred is trimethylolpropane tris(3-mercaptopropionate). Since the photocurable resin composition of the present embodiment contains these, curability and storage stability of the composition become more excellent.

The content of the polyfunctional thiol compound in the photocurable resin composition according to one embodiment of the present invention is preferably 0.1 to 30 parts by mass, more preferably 3 to 25 parts by mass, and still more preferably 5 to 20 parts by mass, based on the total content 100 parts by mass of the component (A) and the component (B). Since the content of the polyfunctional thiol compound is in the above range, a photocurable resin composition having excellent curability while also having low curing heat is obtained.

To the photocurable resin composition according to one embodiment of the present invention, a filler may be added as long as the object of the present invention is not impaired, for the purpose of improving elastic modulus of a cured product, fluidity, etc. Specific examples of the fillers include an inorganic powder and an organic powder.

Examples of the inorganic powder fillers include, but not limited to, glass, fumed silica, alumina, mica, ceramics, a silicone rubber powder, calcium carbonate, aluminum nitride, a carbon powder, kaolin clay, dry clay mineral, dry diatomaceous earth, and kaolin. These may be each used alone, or may be used by mixing two or more. The content of the inorganic powder in the curable resin composition according to one embodiment of the present invention is preferably about 0.1 to 200 parts by mass based on 100 parts by weight of the content of the component (A).

The fumed silica is added for the purpose of modifying viscosity of the photocurable resin composition or improving mechanical strength of a cured product. Preferably, fumed silica having been subjected to surface treatment with dimethylsilane, trimethylsilane, alkylsilane, methacryloxysilane, organochlorosilane, polydimethylsiloxane, hexamethyldisilazane or the like is used. Examples of commercial products of fumed silica include, but not limited to, AEROSIL R972, R972V, R972CF, R974, R976, R976S, R9200, RX50, NAX50, NX90, RX200, RX300, R812, R812S, R8200, RY50, NY50, RY200S, RY200, RY300, R104, R106, R202, R805, R816, T805, R711, and R7200 (manufactured by NIPPON AEROSIL CO., LTD.). These may be each used alone, or may be used by mixing two or more.

Examples of the organic powder fillers include, but not limited to, polyethylene, polypropylene, polystyrene, nylon, polyester, polyvinyl alcohol, polyvinyl butyral, polycarbonate, and polymethyl (meth)acrylate. These may be each used alone, or may be used by mixing two or more. The content of the organic powder in the photocurable resin composition according to one embodiment of the present invention is preferably 0.1 to 200 parts by mass based on 100 parts by mass of the content of the component (A).

The photocurable resin composition according to one embodiment of the present invention may contain a conductive filler. Examples of the conductive fillers include, but not limited to, gold, silver, platinum, nickel, palladium, and plated particles obtained by coating organic polymer particles with metallic thin films. These may be each used alone, or may be used by mixing two or more.

The photocurable resin composition according to one embodiment of the present invention may contain a silane coupling agent. Examples of the silane coupling agents include, but not limited to, γ-chloropropyltrimethoxysilane, octenyltrimethoxysilane, glycidoxyoctyltrimethoxysilane, β-(3,4-epoxycyclohexyl)ethyltrimethoxysilane, γ-glycidoxypropyltrimethoxysilane, γ-mercaptopropyltrimethoxysilane, γ-aminopropyltriethoxysilane, N-β-(aminoethyl)-γ-aminopropyltrimethoxysilane, N-β-(aminoethyl)-γ-aminopropylmethyldimethoxysilane, γ-ureidopropyltriethoxysilane, and p-styryltrimethoxysilane.

These silane coupling agents may be used alone, or may be used by mixing two or more. The content of the silane coupling agent in the photocurable resin composition according to one embodiment of the present invention is preferably 0.05 to 30 parts by mass, and more preferably 0.2 to 10 parts by mass, based on 100 parts by mass of the content of the component (A).

The artificial nail in the present invention refers to a layer formed on a nail of a human or an animal for the purpose of decoration and/or protection. In the artificial nails, for example, a resin substrate (fake nail) in an arbitrary shape for the purpose of decoration and/or protection of a nail is also included. The shape of the artificial nail is not particularly restricted, and the artificial nail may be formed so as to cover a nail, or an artificial nail having a larger size than a nail may be formed for the purpose of extending the nail. Moreover, the artificial nail may be formed for the purpose of bonding items (decorations) for improving the beauty, such as stones, to nails.

Another embodiment of the present invention is a cured product obtained by curing the aforementioned photocurable resin composition (cured product of the curable resin composition). Here, specific examples of the cured products include a basecoat layer used for nail color/art, a color layer, and a topcoat layer.

The artificial nail generally has a structure in which a basecoat layer (layer for the purpose of impartation of adhesive force to a nail, protection of color migration, or the like), a color layer (layer containing a coloring material, etc. and for the purpose of decoration), and a topcoat layer (layer for the purpose of coating, imparting gloss, and improving the beauty) are laminated in this order. In the formation method therefor, first, a basecoat layer obtained by curing a photocurable resin composition for base coating is formed on a surface of a nail, a color layer obtained by curing a photocurable resin composition for coloring is formed thereon, and a topcoat layer obtained by curing a photocurable resin composition for top coating is further formed thereon. Since the photocurable resin composition according to the present invention has low curing heat, it is suitable for use for the basecoat layer that is applied to a surface of a nail. In order to improve appearance of the topcoat layer, a resin composition is sometimes applied and cured so that the resin layer may become thick, but the curing heat of the present photocurable resin composition is low, so that even if the amount to be cured is increased as above, a pain due to the curing heat is not easily felt. On that account, the photocurable resin composition is also suitable for use for the topcoat layer.

A preferred example of the method for coating (decorating) nails or artificial nails according to the present invention will be shown below, but the method according to the present invention is not limited to this method.

When the photocurable resin composition according to the present invention is applied directly to a nail, it is preferable before the treatment with the resin composition to carry out sanding of a surface of a nail using a file (emery board) or the like in order to improve adhesion, and to carry out removal of dust, an oil component, water, etc. using a solvent for nails only containing ethanol as a main component. When the photocurable resin composition according to the present invention is applied, a coating film having a thickness of 50 to 300 µm before curing is formed with a paintbrush, a brush, or the like. The curable resin composition may be directly applied onto a cured film of a resin for base coating or a resin for coloring. In the application, a primer may be used in advance. As an irradiation device during curing, a commercially available nail UV lamp or nail LED lamp is used. The irradiation time is preferably 15 to 120 seconds, but when influence on the finger is considered, it is more preferably 20 to 70 seconds. The accumulated light quantity is preferably 300 to 1,500 mJ/cm$^2$, and more preferably 500 to 1,000 mJ/cm$^2$. When the photocurable resin composition for top coating is cured, a step of wiping a surface of a cured product using an organic solvent or the like may be set for the purpose of removing stickiness to show beautiful gloss.

The photocurable resin composition of the present invention can be produced by a conventionally known method. For example, it can be produced by compounding the components (A) to (D), and if necessary, prescribed amounts of other components, and mixing them using mixing means such as a planetary mixer preferably at a temperature of 10 to 50° C. preferably for 0.1 to 5 hours under the light-blocking conditions.

<Method for Coating (Decorating) Nails or Artificial Nails>

A further embodiment of the present invention is a method for coating nails or artificial nails, comprising applying the photocurable resin composition to a nail or an artificial nail to forma coating film, and then irradiating the coating film with an active energy ray to cure the coating film. In the present specification, "applying . . . onto a nail or an artificial nail" includes a mode of application directly to a surface of a humane nail (bare nail) or an artificial nail (nail chip), and a mode of application onto another single layer or a plurality of other layers formed on a surface of a human nail or an artificial nail are included.

EXAMPLES

Hereinafter, the present invention will be described with examples in more detail, but the present invention is not limited to these examples. In the following examples, operations were carried out at room temperature (25° C.) unless otherwise noted.

<Preparation of Photocurable Resin Composition>

The components shown below were collected in the proportions (parts by mass) shown in Table 1, and they were mixed at 25° C. for 60 minutes using a planetary mixer under the light-blocking conditions, thereby preparing a photocurable resin composition. Details of the components are as follows. The proportion of the component (C) shown in Table 1 is a value containing the component (E) (water) contained as an impurity in a commercial product. For example, in the photocurable resin composition of Example 1, the component c1 is contained in a proportion of 6.15% by weight, and out of this 6.15% by weight, 9 to 11% is water that is the component (E).

«Component (A)» a1: trifunctional alicyclic urethane acrylate oligomer (ART RESIN® KY-11 (when the total amount of KY-11 is 100% by weight, 85% by weight out of it is trifunctional alicyclic urethane acrylate oligomer), manufactured by Negami Chemical Industrial Co., Ltd., weight-average molecular weight: 5,000)

«Component (B)» b1: tripropylene glycol diacrylate (ART RESIN® KY-11 (when the total amount of KY-11 is 100% by weight, 15% by weight out of it is tripropylene glycol diacrylate), manufactured by Negami Chemical Industrial Co., Ltd.)

b2: dimethylol-tricyclodecane diacrylate (LIGHT ACRYLATE (R) DCP-A, manufactured by KYOUEISHA CHEMICAL Co., Ltd.)

b3: 2-hydroxypropyl methacrylate (Acryester HP, manufactured by MITSUBISHI RAYON CO., LTD.)

«Component (C)» c1: polyglycerol (POLYGLYCERIN #750, manufactured by Sakamoto Yakuhin Kogyo Co., Ltd., molecular weight: 758, containing 9 to 11% of water and 5% or less of glycerol)

c2: polyglycerol (POLYGLYCERIN #310, manufactured by Sakamoto Yakuhin Kogyo Co., Ltd., molecular weight: 314, containing 4 to 6% of water and 5 to 15% of glycerol)

c3: polyglycerol (Polyglycerol 20PW, manufactured by Daicel Corporation, molecular weight: 1602, containing 10.1% of water, containing no glycerol)

c4: polyglycerol (Polyglycerol XPW, manufactured by Daicel Corporation, molecular weight: 3222, containing 9.9% of water, containing no glycerol)

c5: polyoxyethylene polyglyceryl ether (SC-E750, manufactured by Sakamoto Yakuhin Kogyo Co., Ltd., weight-average molecular weight: 750, containing 0.11% of water, containing no glycerol)

c6: polyoxypropylene polyglyceryl ether (SC-P750, manufactured by Sakamoto Yakuhin Kogyo Co., Ltd., weight-average molecular weight: 750, containing 0.05% of water, containing no glycerol)

«Component (C') That is Comparative Example of Component (C)» c'1: diglycerol (DIGLYCERIN 801, manufactured by Sakamoto Yakuhin Kogyo Co., Ltd., molecular weight: 166, containing 0.1% of water and 1.0% of glycerol)

c'2: polyglycerol skeleton hexafunctional acrylate (SA-TE6, manufactured by Sakamoto Yakuhin Kogyo Co., Ltd., weight-average molecular weight: 1,000, containing no water and no glycerol)

«Component (D)» d1: 1-hydroxycyclohexyl phenyl ketone (DOUBLECURE® 184, manufactured by Double Bond Chemical Ind. Co., Ltd.)

d2: 2,4,6-trimethylbenzoyl diphenylphosphine oxide (DOUBLECURE® TPO, manufactured by Double Bond Chemical Ind. Co., Ltd.)

«Component (E)» e1: water (pure water, manufactured by KYOUEI PHARMACEUTICAL CO., LTD.)

«Polyfunctional Thiol Compound»

Trimethylolpropane tris(3-mercaptopropionate) (TMMP-20P, manufactured by SC Organic Chemical Co., Ltd.)

Test methods used in Examples and Comparative Examples in Table 1 are as follows.

<Measurement of Curing Exothermic Heat Decrease Rate>

Differential scanning calorimetry (DSC) during active energy ray irradiation was carried out. Into each aluminum sample pan, 0.5 mg of each of the photocurable resin compositions of Table 1 was weighed. Each of the sample pans was set at the prescribed position in a measuring instrument, and an empty sample pan for reference was also set at the prescribed position. Between each sample pan and a high-pressure mercury lamp, a quartz cell was set. The measurement was started in a state where the temperature in the measurement environment was set to 25° C., and after each sample pan was allowed to stand at 25° C. for 1 minute, it was irradiated with the high-pressure mercury lamp at 3 mW for 3 minutes, finally it was allowed to stand at 25° C. for 1 minute, and thus, measurement for 5 minutes in total was carried out. As the maximum value of the DSC peak (μW) (differential scanning calory: change of heat flow accompanying endotherm/exotherm of sample) is decreased, the heat is less felt in the following organoleptic test. When the photocurable resin composition X of the present invention and a resin composition Y which did not contain the component (C) in the resin composition X were each prepared and the DSC peak maximum value of the resin composition X is represented by α(mW) and the DSC peak maximum value of the resin composition Y is represented by β(mW), the curing exothermic heat decrease rate (%) is represented by 100−(α/β×100). In the present invention, the curing exothermic heat decrease rate is preferably more than 5%, more preferably more than 7%, still more preferably more than 9%, and most preferably more than 13%.

That is to say, regarding the photocurable resin composition according to one embodiment of the present invention, the DSC peak maximum value α(mW) of the photocurable resin composition X of the present invention and the DSC peak maximum value β(mW) of the resin composition Y having formulation obtained by removing the component (C) from the formulation of the photocurable resin composition X preferably satisfy the following formula (4):

[Expression 1]

$$100-(\alpha/\beta \times 100) > 5\% \quad (4)$$

<Organoleptic Test>

After the surface of a human fingernail was degreased, each of the photocurable resin compositions of Table 1 was applied thereto so that the thickness might become 100 μm, and then the resin composition was cured using a nail LED lamp (Lxia EX, 30 W, wavelength 395 to 405 nm) (curing conditions: irradiation time seconds, accumulated light quantity 750 mJ/cm 2). Evaluation on the nails of three people was carried out, and during curing, "curing heat" was confirmed based on the following evaluation criteria. In order that a human fingernail should not feel the heat, "good (circle)" is preferable.

«Evaluation Criteria»

Good (circle): Two or more people do not feel their nails hot.

Poor (cross mark): Two or more people feel their nails hot.

<Viscosity Measurement>

The photocurable resin compositions of Table 1 were each collected in an amount of 0.5 mL and discharged into respective measuring cups. Viscosity measurement was carried out with an EHD type viscometer (manufactured by Toki Sangyo Co., Ltd.) under the following conditions. Each result was taken as a "viscosity Pa·s". From the viewpoint of workability during coating (decoration) of nails, such as suppression of flow of the composition or ease of coating, the viscosity of the composition is preferably 0.5 to 150 Pa·s.

«Evaluation Criteria»

Good (circle): 0.5 to 150 Pa·s

Poor (cross mark): less than 0.5 Pa·s or more than 150 Pa·s

«Measurement Conditions»

Cone rotor: 3°×R14

Rotational speed: 1 rpm

Measurement time: 3 minutes

Measurement temperature: 25° C. (temperature control was carried out by a constant-temperature bath)

<Hardness Measurement>

On a soda-lime glass of 1.0×150×150 mm, a spacer having a thickness of 1 mm was placed, and the resin was applied. A PET film was superposed thereon, then another soda-lime glass was further superposed to sandwich the resin, and using a high-pressure mercury lamp (curing conditions: accumulated light quantity 30 kJ/m 2), irradiation was carried out twice from the front surface and from the back surface of the two soda-lime glasses, thereby preparing a cured product having a thickness of 1 mm (curing was carried out by making adjustment so that UV transmitted by the PET film and the soda-lime glass might meet the aforementioned curing conditions). Three cured products were prepared in the same manner as above, and they were allowed to stand for 2 hours. Thereafter, the soda-lime glass and the PET film were peeled off, and the three sheet-like cured products each having a thickness of 1 mm were superposed in such a manner that the surface to which the PET film had adhered faced up. On the smooth surface, a hardness of the superposed sheet-like cured products was measured using a type D durometer tester. The measurement was carried out five times, and excluding the maximum value and the minimum value, an average of values of three times was determined. In order that the cured product should not be easily damaged and should not easily peel off in daily life, the hardness is preferably 70 or more.

«Evaluation Criteria»

Good (circle): D70 or more

Poor (cross mark): less than D70

«Measurement Conditions»

Durometer pressing speed: 3.0 mm/sec

Numerical value reading method: maximum value within one second after a tip of measurement unit of the durometer has come into close contact with the measurement object

TABLE 1

|   | Example 1 | Example 2 | Example 3 | Example 4 | Example 5 | Example 6 | Example 7 | Example 8 |
|---|---|---|---|---|---|---|---|---|
| a1 | 51 | 51 | 51 | 51 | 51 | 51 | 51 | 51 |
| b1 | 9 | 9 | 9 | 9 | 9 | 9 | 9 | 9 |
| b2 | 10 | 10 | 10 | 10 | 10 | 10 | 10 | 10 |
| b3 | 30 | 30 | 30 | 30 | 30 | 30 | 30 | 30 |
| c1 | 6.15 | 18.5 |  |  |  |  |  |  |
| c2 |  |  | 6.15 |  |  |  |  | 6.15 |
| c3 |  |  |  | 6.15 |  |  |  |  |
| C4 |  |  |  |  | 6.15 |  |  |  |
| c5 |  |  |  |  |  | 6.15 |  |  |
| c6 |  |  |  |  |  |  | 6.15 |  |
| c'1 |  |  |  |  |  |  |  |  |
| c'2 |  |  |  |  |  |  |  |  |
| d1 | 3 | 3 | 3 | 3 | 3 | 3 | 3 | 3 |
| d2 | 2.5 | 2.5 | 2.5 | 2.5 | 2.5 | 2.5 | 2.5 | 2.5 |
| e1 |  |  |  |  |  |  |  | 0.31 |
| Polyfunctional thiol compound | 17.4 | 17.4 | 17.4 | 7.4 | 17.4 | 17.4 | 17.4 | 17.4 |
| Total | 129.1 | 141.4 | 129.1 | 129.1 | 129.1 | 129.1 | 129.1 | 129.4 |
| DSC peak maximum value (mW) | 14.1 | 12.5 | 13.1 | 13.9 | 14.2 | 13.1 | 9.5 | 10.1 |
| Curing exothermic heat decrease rate (%) | 5.9 | 16.6 | 12.9 | 7.2 | 5.2 | 12.6 | 36.6 | 32.4 |
| Curing heat | ○ | ○ | ○ | ○ | ○ | ○ | ○ | ○ |
| Viscosity | ○ | ○ | ○ | ○ | ○ | ○ | ○ | ○ |
| Hardness | ○ | ○ | ○ | ○ | ○ | ○ | ○ | ○ |

|   | Example 9 | Example 10 | Comparative Example 1 | Comparative Example 2 | Comparative Example 3 | Comparative Example 4 |
|---|---|---|---|---|---|---|
| a1 | 51 | 51 | 51 | 51 | 51 | 51 |
| b1 | 9 | 9 | 9 | 9 | 9 | 9 |
| b2 | 10 | 10 | 10 | 10 | 10 | 10 |
| b3 | 30 | 30 | 30 | 30 | 30 | 30 |
| c1 |  |  |  |  |  |  |
| c2 |  |  |  |  |  |  |
| c3 |  |  |  |  |  |  |
| C4 |  |  |  |  |  |  |
| c5 | 6.15 |  |  |  |  |  |
| c6 |  | 6.15 |  |  |  |  |
| c'1 |  |  |  | 6.15 |  |  |
| c'2 |  |  |  |  | 6.15 | 6.15 |

TABLE 1-continued

|  | | | | | | |
|---|---|---|---|---|---|---|
| d1 | 3 | 3 | 3 | 3 | 3 | 3 |
| d2 | 2.5 | 2.5 | 2.5 | 2.5 | 2.5 | 2.5 |
| e1 | 0.31 | 0.31 | | | | 0.31 |
| Polyfunctional thiol compound | 17.4 | 17.4 | 17.4 | 17.4 | 17.4 | 17.4 |
| Total | 129.4 | 129.4 | 122.9 | 129.1 | 129.1 | 129.4 |
| DSC peak maximum value (mW) | 9.2 | 11.4 | 15.0 | 15.7 | 14.6 | 14.4 |
| Curing exothermic heat decrease rate (%) | 38.9 | 23.9 | 0.0 | −4.9 | 2.6 | 4.1 |
| Curing heat | ○ | ○ | x | x | x | x |
| Viscosity | ○ | ○ | ○ | ○ | ○ | ○ |
| Hardness | ○ | ○ | ○ | ○ | ○ | ○ |

According to Examples of Table 1, it can be understood that they are photocurable resin compositions that do not feel hot during curing. Example 1 differed from Example 2 in the content of the component (C), and Example 1 differed from Examples 3 to 7 in the component (C), but they were photocurable resin compositions that had a high curing exothermic heat decrease rate and did not feel hot even in the organoleptic test. Moreover, since they each had a viscosity in a range useful for coating nails, cured products were also sufficiently hard, so that they are suitable for application to human nails.

According to Comparative Examples of Table 1, the curing exothermic heat decrease rate of Comparative Example 1 was 0% because Comparative Example 1 did not contain the component (C), and as a result of the organoleptic test, the heat was felt. The c'1 of Comparative Example 2 was diglycerol having a molecular weight of less than 200, but it proved to have an opposite effect on the decrease in curing exothermic heat. The c'2 of each of Comparative Examples 3 and 4 was a compound having a polyglycerol skeleton and a methacryloyl group, but it did not contribute to decrease in curing exothermic heat, and as a result of the organoleptic test, the heat was felt.

INDUSTRIAL APPLICABILITY

The photocurable resin composition of the present invention is a photocurable resin composition having a viscosity in a range useful for coating nails while also having low curing heat and providing a cured product that is sufficiently hard, so that it can be widely used in a nail field.

The present application is based on Japanese Patent Application No. 2021-12014 filed on Jan. 28, 2021, and the disclosed contents thereof are incorporated herein in its entirety by reference.

The invention claimed is:

1. A photocurable resin composition for nails or artificial nails, comprising the following components (A) to (D), wherein a molecular weight of the component (C) is 200 or more;
    a component (A): a urethane (meth)acrylate oligomer,
    a component (B): a monomer selected from the group consisting of a (meth)acrylate monomer, a (meth)acrylamide monomer, and (meth)acrylic acid (excluding the component (A)),
    a component (C): polyglycerol having no (meth)acryloyl group and/or a compound having a polyglyceryl ether skeleton having no (meth)acryloyl group,
    a component (D): a photoinitiator.

2. The photocurable resin composition for nails or artificial nails according to claim 1, wherein the molecular weight of the component (C) is 200 or more and 5,000 or less.

3. The photocurable resin composition for nails or artificial nails according to claim 1, wherein the component (C) is polyglycerol having no (meth)acryloyl group and/or a polyoxyalkylene polyglyceryl ether having no (meth)acryloyl group.

4. The photocurable resin composition for nails or artificial nails according to claim 1, further comprising water as a component (E).

5. The photocurable resin composition for nails or artificial nails according to claim 1, wherein the component (D) is an acylphosphine oxide-based photoinitiator and/or an alkylphenone-based photoinitiator.

6. The photocurable resin composition for nails or artificial nails according to claim 1, comprising, based on 100 parts by mass of the component (A), 10 to 200 parts by mass of the component (B), and comprising, based on 100 parts by mass of the component (A) and the component (B), 0.1 to 50 parts by mass of the component (C) and 0.1 to 15 parts by mass of the component (D).

7. The photocurable resin composition for nails or artificial nails according to claim 1, further comprising a polyfunctional thiol compound.

8. The photocurable resin composition for nails or artificial nails according to claim 1, satisfying the following conditions:
    when the photocurable resin composition X for nails or artificial nails and a resin composition Y which does not contain the component (C) in the resin composition X are each prepared, a DSC peak maximum value α (mW) of the resin composition X and a DSC peak maximum value β (mW) of the resin composition Y satisfy $100-(\alpha/\beta \times 100) > 5\%$.

9. A cured product obtained by curing the photocurable resin composition for nails or artificial nails according to claim 1.

10. A method for coating nails or artificial nails, comprising applying the photocurable resin composition for nails or artificial nails according to claim 1 to a nail or an artificial nail to form a coating film, and then irradiating the coating film with an active energy ray to cure the coating film.

* * * * *